(12) United States Patent
Oda

(10) Patent No.: US 11,289,618 B2
(45) Date of Patent: Mar. 29, 2022

(54) SOLID-STATE IMAGING DEVICE

(71) Applicant: Tower Partners Semiconductor Co., Ltd., Toyama (JP)

(72) Inventor: Masahiro Oda, Uozu (JP)

(73) Assignee: Tower Partners Semiconductor Co., Ltd., Toyama (JP)

( * ) Notice: Subject to any disclaimer, the term of this patent is extended or adjusted under 35 U.S.C. 154(b) by 0 days.

(21) Appl. No.: 16/033,478

(22) Filed: Jul. 12, 2018

(65) Prior Publication Data

US 2018/0323232 A1 Nov. 8, 2018

Related U.S. Application Data

(63) Continuation of application No. PCT/JP2016/085074, filed on Nov. 25, 2016.

(30) Foreign Application Priority Data

Jan. 15, 2016 (JP) .............................. JP2016-005977

(51) Int. Cl.
*H01L 31/10* (2006.01)
*H04N 5/359* (2011.01)
(Continued)

(52) U.S. Cl.
CPC ............ *H01L 31/10* (2013.01); *H01L 27/146* (2013.01); *H01L 27/14647* (2013.01);
(Continued)

(58) Field of Classification Search
CPC ......... H01L 27/14647; H01L 27/14652; H01L 27/14656; H01L 27/14683; H01L 31/10;
(Continued)

(56) References Cited

U.S. PATENT DOCUMENTS

2008/0251822 A1 10/2008 Yamaguchi
2009/0050947 A1* 2/2009 Dungan ............ H01L 27/14625
257/294
(Continued)

FOREIGN PATENT DOCUMENTS

JP H0774340 A 3/1995
JP 2001053264 A 2/2001
(Continued)

OTHER PUBLICATIONS

International Search Report for corresponding application PCT/JP2016/085074 filed Nov. 25, 2016; dated Feb. 21, 2017.

*Primary Examiner* — Vongsavanh Sengdara
(74) *Attorney, Agent, or Firm* — Knobbe, Martens, Olson & Bear, LLP

(57) ABSTRACT

A solid-state imaging device includes a plurality of pixels two-dimensionally arranged on a semiconductor substrate. Each of the pixels includes at least one shallow light receiving portion formed near a surface of the semiconductor substrate and at least one deep light receiving portion formed under the shallow light receiving portion. One or more of the shallow light receiving portions and the deep light receiving portion are connected to each other so as to form a second light receiving portion. The rest of the shallow light receiving portions forms a first light receiving portion. Excess electric charge in the first light receiving portion is discharged to the deep light receiving portion.

11 Claims, 9 Drawing Sheets

(51) Int. Cl.
*H04N 5/374* (2011.01)
*H04N 5/369* (2011.01)
*H01L 27/146* (2006.01)

(52) U.S. Cl.
CPC .. *H01L 27/14652* (2013.01); *H01L 27/14656* (2013.01); *H04N 5/359* (2013.01); *H04N 5/369* (2013.01); *H04N 5/374* (2013.01); *H01L 27/14683* (2013.01)

(58) Field of Classification Search
CPC ...... H01L 27/146; H04N 5/359; H04N 5/369; H04N 5/374
See application file for complete search history.

(56) References Cited

U.S. PATENT DOCUMENTS

| | | |
|---|---|---|
| 2009/0278048 A1 | 11/2009 | Choe |
| 2010/0032736 A1 | 2/2010 | Sudo |
| 2010/0177226 A1* | 7/2010 | Itonaga ............. H01L 27/14645 348/300 |
| 2010/0220228 A1 | 9/2010 | Otake |
| 2011/0068429 A1 | 3/2011 | Venezia |
| 2012/0146116 A1 | 6/2012 | Sato |
| 2013/0009263 A1* | 1/2013 | Hatano ............... H01L 27/1464 257/432 |
| 2016/0027837 A1 | 1/2016 | Webster |
| 2016/0111457 A1* | 4/2016 | Sekine ............. H01L 27/14612 257/228 |

FOREIGN PATENT DOCUMENTS

| | | |
|---|---|---|
| JP | 2006041866 A | 2/2006 |
| JP | 2008147471 A | 6/2008 |
| JP | 2009272620 A | 11/2009 |
| JP | 201040840 A | 2/2010 |
| WO | 2010004683 A1 | 1/2010 |
| WO | 2015037547 A1 | 3/2015 |

* cited by examiner

FIG.1

|   | G | R | G | R | G | R |
|---|---|---|---|---|---|---|
|   | B | IR | B | IR | B | IR | 31,32
|   | G | R | G | R | G | R | 31
|   | B | IR | B | IR | B | IR |
|   | G | R | G | R | G | R |
| II | B | IR | B | IR II' | B | IR |

SOLID-STATE IMAGING DEVICE

CROSS-REFERENCE TO RELATED APPLICATIONS

This is a continuation of International Application No. PCT/JP2016/85074 filed on Nov. 25, 2016, which claims priority to Japanese Patent Application No. 2016-005977 filed on Jan. 15, 2016. The entire disclosures of these applications are incorporated by reference herein.

BACKGROUND

The present invention relates to a solid-state imaging device used as a two-dimensional image sensor and the like.

In recent years, there has been developed many image sensors capable of obtaining both an image of a visible region and an image of an infrared region. Specifically, an image sensor using a silicon substrate has been designed to improve infrared sensitivity because infrared light has a smaller absorption coefficient with respect to silicon as compared with visible light. For example, Japanese Unexamined Patent Publication No. 2009-272620 (Patent Document 1) discloses that a photodiode photoelectrically converting infrared light extends to a lower part of a photodiode photoelectrically converting visible light so as to improve infrared sensitivity.

SUMMARY

In a solid-state imaging device, when excess electric charge is generated in a light receiving portion, the electric charge overflows into an adjacent pixel and this overflow causes deterioration in image quality such as color mixture. In order to prevent the occurrence of deterioration in image quality, there is provided a drain for discharging excess electric charge.

However, as disclosed in Patent Document 1, in the structure where an infrared light receiving portion extends to a lower part of a visible light receiving portion, a drain for discharging excess electric charge generated in the visible light receiving portion is required to be formed on a surface side of a substrate. In this formation, the light receiving portion becomes narrower, thereby reducing saturation output and sensitivity.

In view of the foregoing, an imaging device capable of obtaining favorable image quality in which color mixture and reduction in saturation output and sensitivity are reduced even when an infrared light receiving portion extends to a lower part of a visible light receiving portion will be described.

A solid-state imaging device of the present disclosure includes a plurality of pixels two-dimensionally arranged on a semiconductor substrate. Each of the pixels includes at least one shallow light receiving portion formed near a surface of the semiconductor substrate and at least one deep light receiving portion formed under the shallow light receiving portion. One or more of the shallow light receiving portions and the deep light receiving portion are connected to each other so as to form a second light receiving portion. The rest of the shallow light receiving portions forms a first light receiving portion. Excess electric charge in the first light receiving portion is discharged to the deep light receiving portion.

In the solid-state imaging device of the present disclosure, by discharging excess electric charge in the first light receiving portion to the deep light receiving portion, a drain for discharging the excess electric charge is no longer required to be provided on a surface side of a substrate. Thus, the light receiving portion does not become narrow, and excess electric charge is properly discharged, which reduces color mixture and the like. As a result, a favorable image can be obtained.

BRIEF DESCRIPTION OF THE DRAWINGS

FIG. 1 is a plan view schematically illustrating two-dimensional arrangement of pixels and light receiving portions in an exemplary solid-state imaging device of the present disclosure.

DETAILED DESCRIPTION

An exemplary solid-state imaging device of the present disclosure will now be described with reference to the accompanying drawings.

Figure 2:
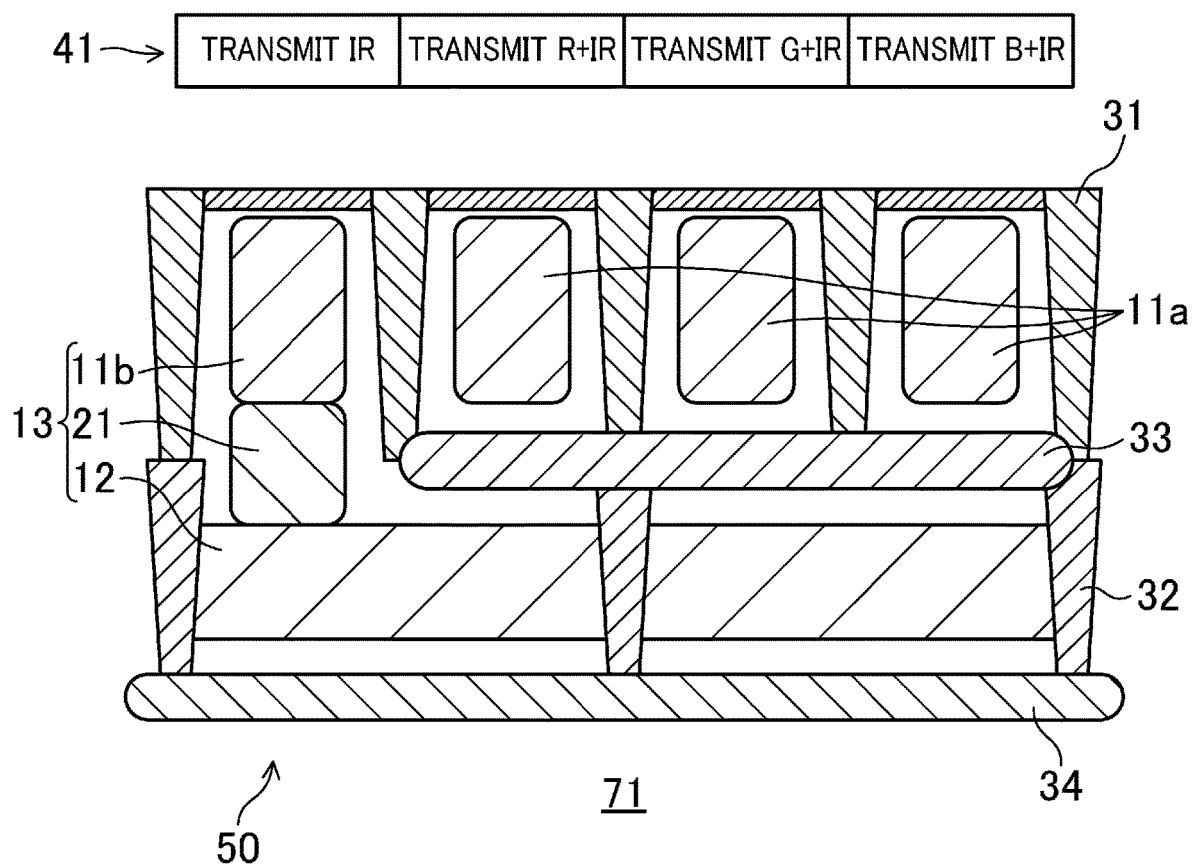
FIG. 2 is a view schematically illustrating a cross-section of the solid-state imaging device taken along the line II-II in FIG. 1.

FIGS. 1 and 2 are schematic views illustrating the configuration of an exemplary solid-state imaging device 50. FIG. 1 is a plan view illustrating arrangement of pixels and light receiving portions in the solid-state imaging device 50. FIG. 2 is a cross-sectional view illustrating the cross sectional configuration of the solid-state imaging device 50 taken along the line II-II' in FIG. 1.

As illustrated in FIG. 1, a plurality of pixels are two-dimensionally arranged on a semiconductor substrate made of such as silicon. Each of the pixels includes, in a 2 by 2 arrangement, light receiving portions that include color filters corresponding to four colors including red (R), green (G), and blue (B), which is visible light, and infrared light (IR). The color filters corresponding to R, G, and B transmit visible light of the respective colors and infrared light, and an IR filter transmits only infrared light.

As illustrated in FIG. 2, the solid-state imaging device 50 includes shallow light receiving portions 11 (11a and 11b) formed near a surface of a semiconductor substrate 71, and a deep light receiving portion 12 formed under the shallow light receiving portions 11. In the solid-state imaging device 50 as an example, the deep light receiving portion 12 extends under and across the 2-by-2 four shallow light receiving portions 11 included in one pixel, and is connected to part (11b) of the shallow light receiving portions by a connection portion 21 so as to form a second light receiving portion 13. The IR filter is provided above the shallow light receiving portion 11b forming the second light receiving portion 13. The other shallow light receiving portions 11a that do not form the second light receiving portion 13 are each provided with one of the visible light filters, and form a first light receiving portion that receives light of the corresponding color. Even the first light receiving portion can absorb part of infrared light when the infrared light is incident thereon. Even the second light receiving portion can absorb part of visible light (especially, red light on a long wavelength side) when the visible light is incident thereon.

A shallow horizontal separation portion 31 is provided between the shallow light receiving portions 11. In other words, the shallow light receiving portions 11 are two-dimensionally arranged with the shallow horizontal separation portion 31 intervening between adjacent shallow light receiving portions 11. Similarly, a deep horizontal separation portion 32 is provided between the deep light receiving portions 12. In other words, the deep light receiving portions 12 are two-dimensionally arranged with the deep horizontal separation portion 32 intervening between adjacent deep light receiving portions 12. A vertical separation portion 33 is provided between the shallow light receiving portions 11 and the deep light receiving portion 12. These separation portions each separate the light receiving portions. Furthermore, under the deep light receiving portion 12, there is provided a vertical overflow barrier 34 that separates between the deep light receiving portion 12 and a portion of the semiconductor substrate 71 under the deep light receiving portion 12.

All of the shallow light receiving portions 11 (11a and 11b), the deep light receiving portion 12, the connection portion 21, the shallow horizontal separation portion 31, the deep horizontal separation portion 32, the vertical separation portion 33, and the vertical overflow barrier 34 are formed by, for example, introducing impurities into the semiconductor substrate 71.

In the solid-state imaging device 50, a potential barrier of the vertical separation portion 33 is set to be smaller than a potential barrier of the shallow horizontal separation portion 31. This setting is made by, for example, making potential (electric potential) of the vertical separation portion 33 higher than potential of the shallow horizontal separation portion 31 if a carrier of electric charge is an electron.

In this manner, excess electric charge that is generated in the shallow light receiving portions 11a forming the first light receiving portion is allowed to overflow through the vertical separation portion 33, where the electric charge flows over a potential barrier more easily than a potential barrier of the shallow horizontal separation portion 31, and can be discharged to the deep light receiving portion 12. In this configuration, when obtaining a visible light image, occurrence of color mixture due to leakage, in the horizontal direction, of excess electric charge generated in the shallow light receiving portions 11a is reduced, thereby making it possible to obtain a favorable visible light image.

In addition, a drain for discharging excess electric charge is no longer required to be provided near a surface of the semiconductor substrate 71 of the shallow light receiving portions 11. Thus, reduction in the area of the light receiving portions and reduction in saturation output and sensitivity can be avoided.

Figure 11:
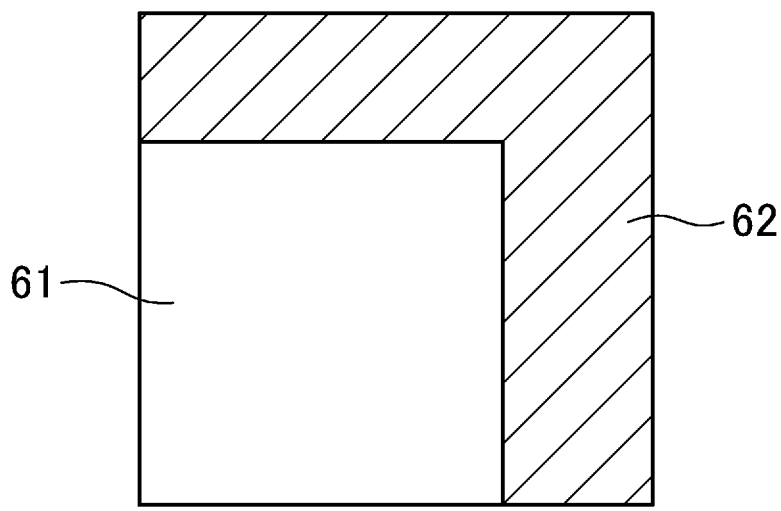
FIG. 11 is a plan view schematically illustrating the arrangement of a light receiving portion and a readout circuit in the solid-state imaging device of the present disclosure.
Figure 12:
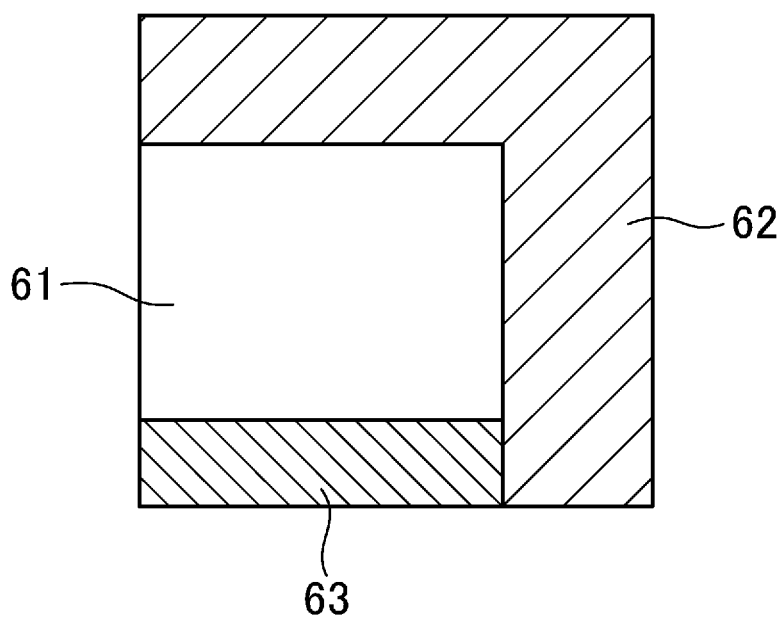
FIG. 12 is a plan view schematically illustrating a drain in addition to the light receiving portion and the readout circuit included in a conventional solid-state imaging device.

FIGS. 11 and 12 show the details. FIG. 12 is a plan view schematically illustrating a conventional solid-state imaging device in which a second light receiving portion is provided under a first light receiving portion. FIG. 12 illustrates a relation among one light receiving portion 61, a readout circuit 62 for reading out a signal from the light receiving portion 61, and a drain 63 for discharging excess electric charge generated in the light receiving portion 61. In the conventional solid-state imaging device, the drain 63 is required to be provided to a surface side of the semiconductor substrate 71, and the area where the light receiving portion 61 can be provided is reduced by the area occupied by the drain 63. This results in a reduction in saturation output and also a narrow path of light. As a result, less light can be received and sensitivity is reduced.

By contrast, FIG. 11 is a plan view illustrating an example solid-state imaging device 50 of the present application that includes one light receiving portion 61 and the readout circuit 62 for reading out a signal from the light receiving portion 61, and does not include the drain 63. With the configuration as shown in FIG. 2 where excess electric charge in the shallow light receiving portions 11a is discharged to the deep light receiving portion 12, the drain 63 is no longer required to be provided on a surface side of the semiconductor substrate 71. Thus, the configuration as shown in FIG. 12 allows the light receiving portion 61 to have an increased area, and hence provide a higher sensitivity than the configuration shown in FIG. 11.

Potential barriers of both the vertical separation portion 33 and the vertical overflow barrier 34 in the solid-state imaging device 50 may be smaller (electric potential may be higher if a carrier of electric charge is an electron) than a potential barrier of the deep horizontal separation portion 32. Thus, in obtaining an infrared image, excess electric charge generated in the deep light receiving portion 12 is discharged toward the shallow light receiving portions 11a or toward a portion of the semiconductor substrate 71 under the vertical overflow barrier 34. That is, occurrence of color mixture due to leakage of excess electric charge in a horizontal direction (to the adjacent deep light receiving portion 12) is reduced, thereby making it possible to obtain a favorable infrared image. In this case, as well, as illustrated in FIGS. 11 and 12, the drain for discharging excess electric charge is not required to be provided on a surface side of the semiconductor substrate 71, and saturation output and sensitivity can be improved.

In addition, a potential barrier of the vertical overflow barrier 34 may be smaller (electric potential may be higher if a carrier of electric charge is an electron) than a potential barrier of the vertical separation portion 33. In this case, excess electric charge generated in the deep light receiving portion 12 is discharged to the portion of the semiconductor substrate 71 under the vertical overflow barrier 34.

In this configuration, in obtaining a visible light image, even when excess electric charge discharged from the shallow light receiving portions 11a to the deep light receiving portion 12 is accumulated in the deep light receiving portion 12, the electric charge is further discharged toward the semiconductor substrate 71 through the vertical overflow barrier 34, thereby making it possible to reduce backflow toward the shallow light receiving portions 11a, and thus obtaining a favorable visible light image free of deterioration in image quality. In obtaining an infrared image, if the excess electric charge is discharged from the deep light receiving portion 12 to the shallow light receiving portions 11a, and reaches an excessive amount in the shallow light receiving portions 11a, the excess electric charge may flow back into the deep light receiving portion 12. By contrast, the vertical overflow barrier 34 having a smaller potential barrier than the vertical separation portion 33 allows the excess electric charge generated in the deep light receiving portion 12 to be effectively discharged toward the semiconductor substrate 71, thereby obtaining a favorable infrared image free of deterioration in image quality.

In this manner, the configuration of the present embodiment can properly discharge not only the excess electric charge generated in the first light receiving portion (the shallow light receiving portions 11a) and the second light receiving portion 13 but also the excess electric charge discharged from the other portions.

Figure 3:
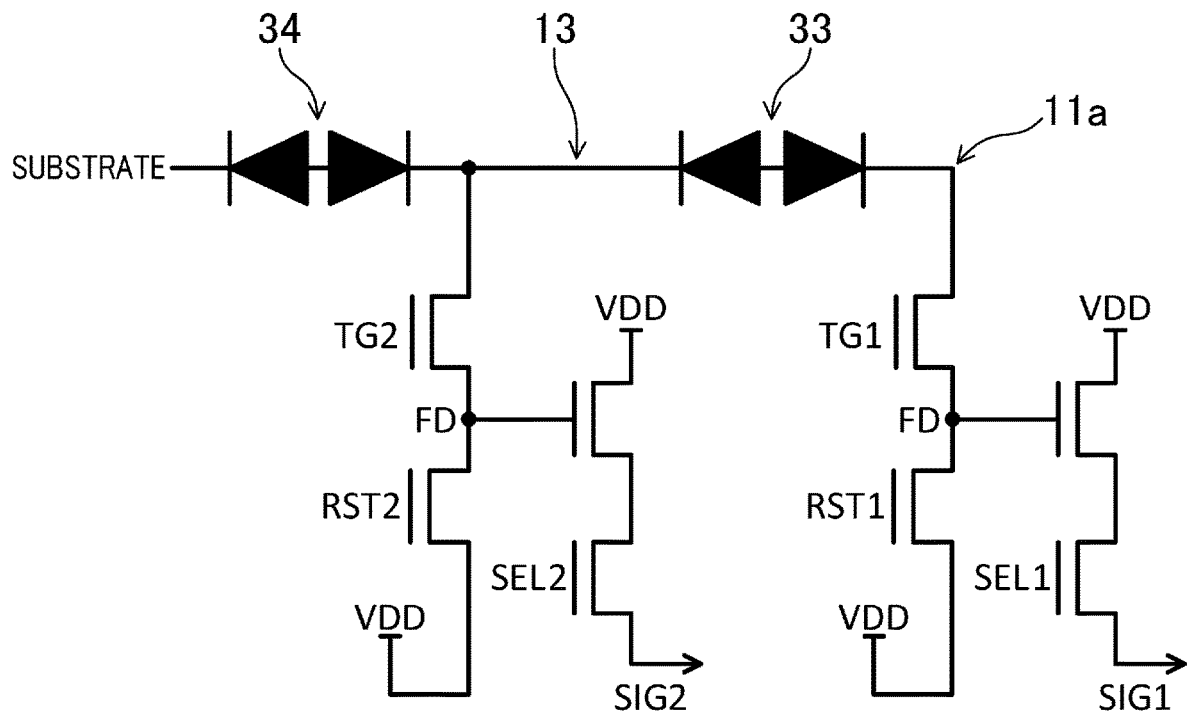
FIG. 3 is an equivalent circuit diagram of the exemplary solid-state imaging device.

FIG. 3 is an equivalent circuit diagram of an example of the solid-state imaging device 50. FIG. 3 illustrates the shallow light receiving portion 11a (the first light receiving portion), the second light receiving portion 13, the vertical separation portion 33 that separates between the shallow light receiving portion 11a and the second light receiving portion 13, and the vertical overflow barrier 34 that separates between the second light receiving portion 13 and a portion of the semiconductor substrate under the second light receiving portion 13. FIG. 3 also illustrates transfer gates TG1 and TG2 that read out a signal from the shallow light receiving portion 11a and the second light receiving portion 13, and a readout circuit where these portions are connected.

When light enters the shallow light receiving portion 11a or the second light receiving portion 13, photoelectric conversion is performed, and a signal electron is generated and accumulated. The signal electron is read out by an electron-voltage conversion circuit including floating diffusion (FD) by controlling a voltage applied to the transfer gates TG1 and TG2, and is output as a voltage signal SIG1 or SIG2. In addition, reset gates RST1 and RST2 for resetting the read electron are mounted. The signal electron is discharged through a drain adjacent to the reset gates after a signal electron is read out as a voltage signal, by controlling these reset gates. Pixels for reading out a signal are selected by controlling selection transistors SEL1 or SEL2. VDD indicates a power-supply voltage.

Figure 4:
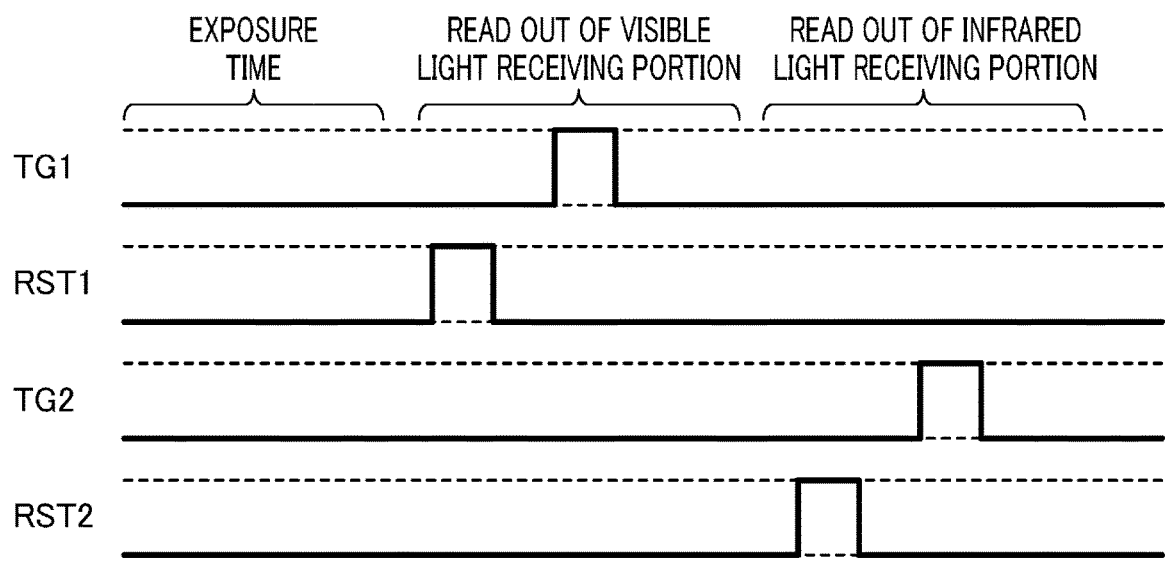
FIG. 4 is a view illustrating an example of a method for driving the exemplary solid-state imaging device during imaging.

FIG. 4 illustrates an example operation timing between TG1 and TG2, and between RST1 and RST2, in obtaining an image by the solid-state imaging device 50 including the equivalent circuit illustrated in FIG. 3.

In the operation in FIG. 4, all of the reset gates RST1 and RST2 and the transfer gates TG1 and TG2 are kept closed during an exposure time. At the time of readout of the first light receiving portion, the reset gate RST1 is temporarily open to reset the FD, and then the transfer gate TG1 is temporarily open to read out a signal electron. When excess electric charge is generated in the first light receiving portion (the shallow light receiving portions 11a), the excess electric charge is discharged to the deep light receiving portion 12 by simply reading out a signal of the first light receiving portion as just described, thereby obtaining a favorable visible light image. As described above, this effect is achieved by setting potential barriers of the shallow horizontal separation portion 31 and the vertical separation portion 33.

At the time of readout of the second light receiving portion, the reset gate RST2 is temporarily open to reset the FD, and then the transfer gate TG2 is temporarily open to read out a signal electron.

Figure 5:
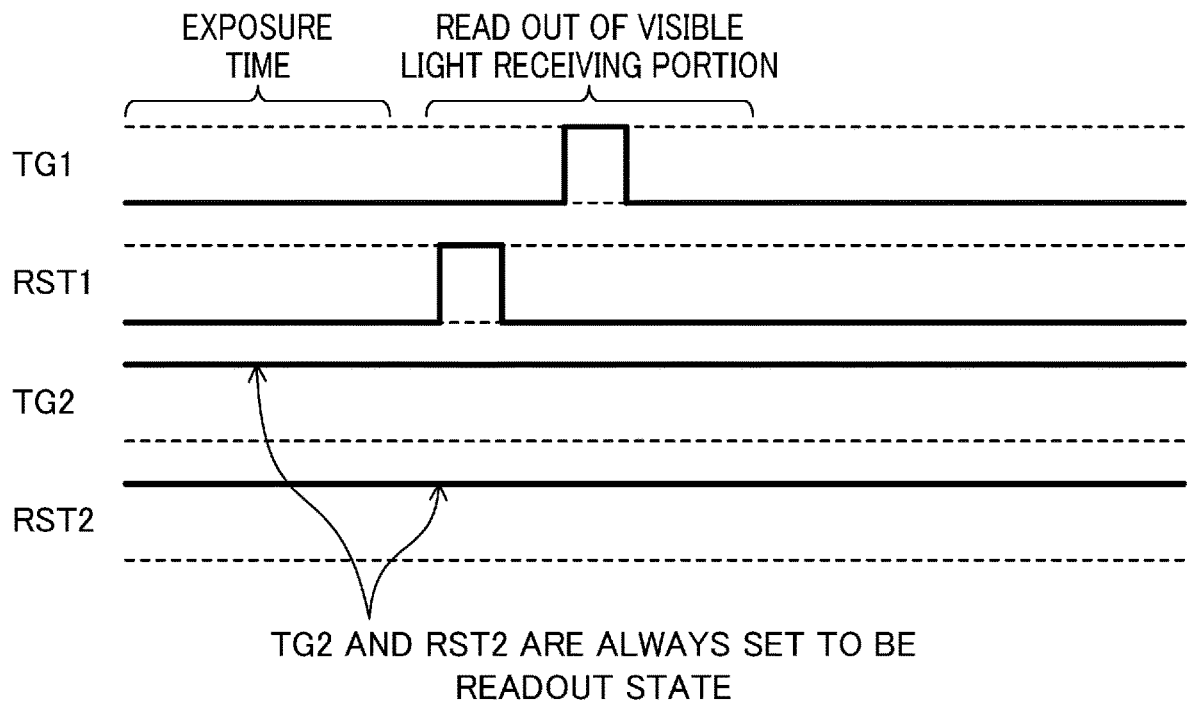
FIG. 5 is a view illustrating an example of a more preferable method for driving the exemplary solid-state imaging device during imaging.

FIG. 5 illustrates a driving method for obtaining a more favorable visible light image. In this driving method, the transfer gate TG2 and the reset gate RST2 for the second light receiving portion are set to be a readout state (an open state) during an exposure time and a readout period of the first light receiving portion. In this manner, excess electric charge discharged from the first light receiving portion (the shallow light receiving portions 11a) to the second light receiving portion (the deep light receiving portion 12) can be discharged through the transfer gate TG2. Thus, excess electric charge does not flow back from the second light receiving portion into the first light receiving portion. Deterioration in image quality is thus reduced more reliably, thereby making it possible to obtain a favorable visible image.

Figure 6:
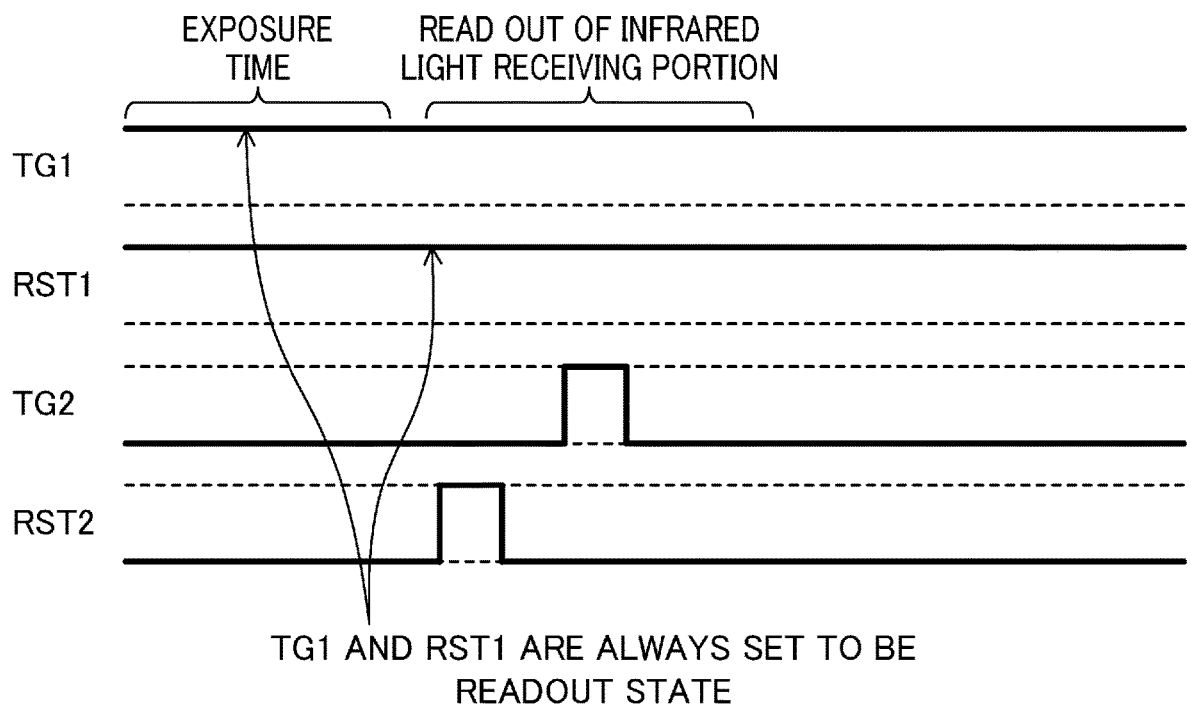
FIG. 6 is a view illustrating an example of a more preferable method for driving the exemplary solid-state imaging device during imaging.

FIG. 6 illustrates a driving method for obtaining a more favorable infrared image. In this driving method, the transfer gate TG1 and the reset gate RST1 for the first light receiving portion are set to be a readout state (an open state) during an exposure time and a readout period of the second light receiving portion. In this configuration, even when excess electric charge is generated in the first light receiving portion (the shallow light receiving portions 11a), the electric charge is discharged through the transfer gate TG1 and the reset gate RST1, and is not discharged to the second light receiving portion (the deep light receiving portion 12). Thus, a favorable infrared image where deterioration in image quality is reduced can be obtained.

MODIFICATIONS

The above features are non-limiting examples. Modifications which will be described below are also non-limiting examples.

A color filter arrangement illustrated in FIG. 1 has been described as an embodiment, but another arrangement may also be applied. For example, an alternate pattern in which the second light receiving portion and a white light receiving portion are arranged alternately may be applied. The example where each pixel includes a 2 by 2 arrangement of the light receiving portions (the shallow light receiving portions 11a and 11b) has been described, but any arrangement such as 3 by 3 and 2 by 3 may be applicable.

Figure 7:
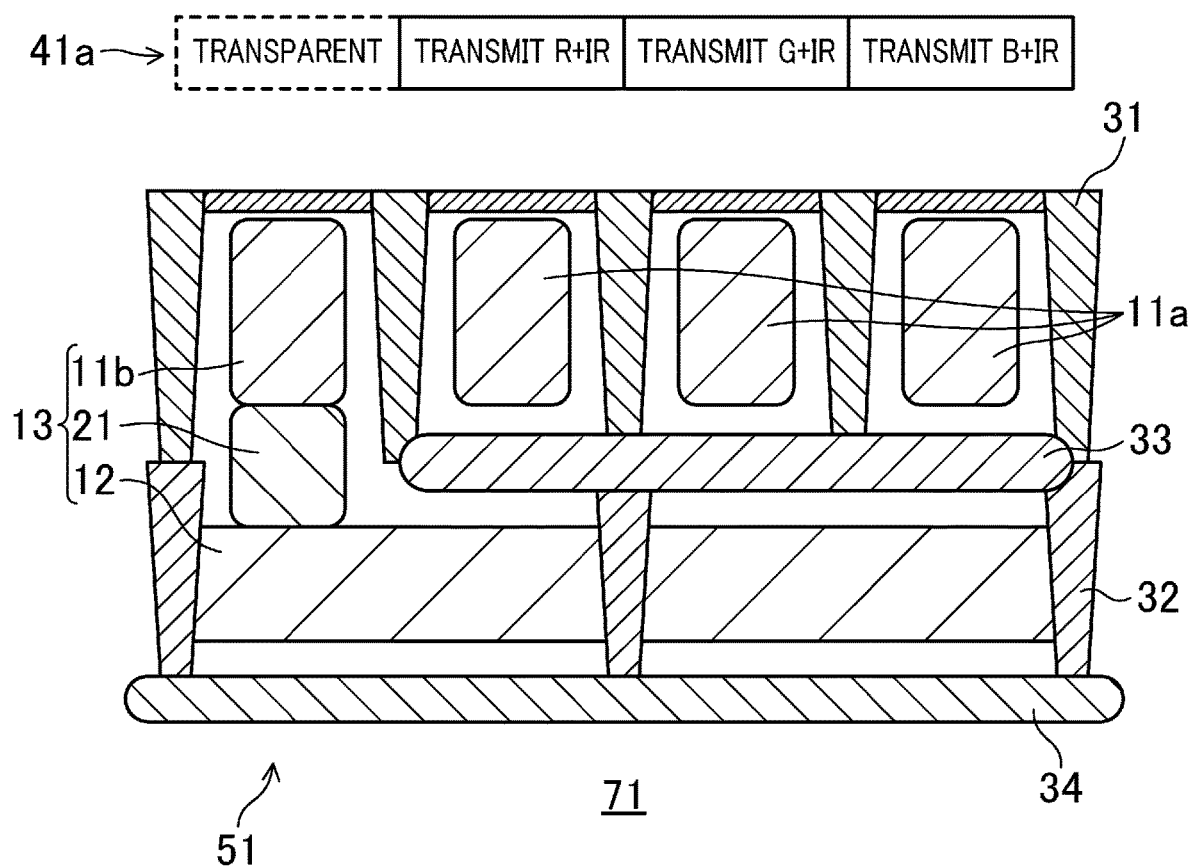
FIG. 7 is a view illustrating a modification related to a color filter in a solid-state imaging device of the present disclosure.
Figure 8:
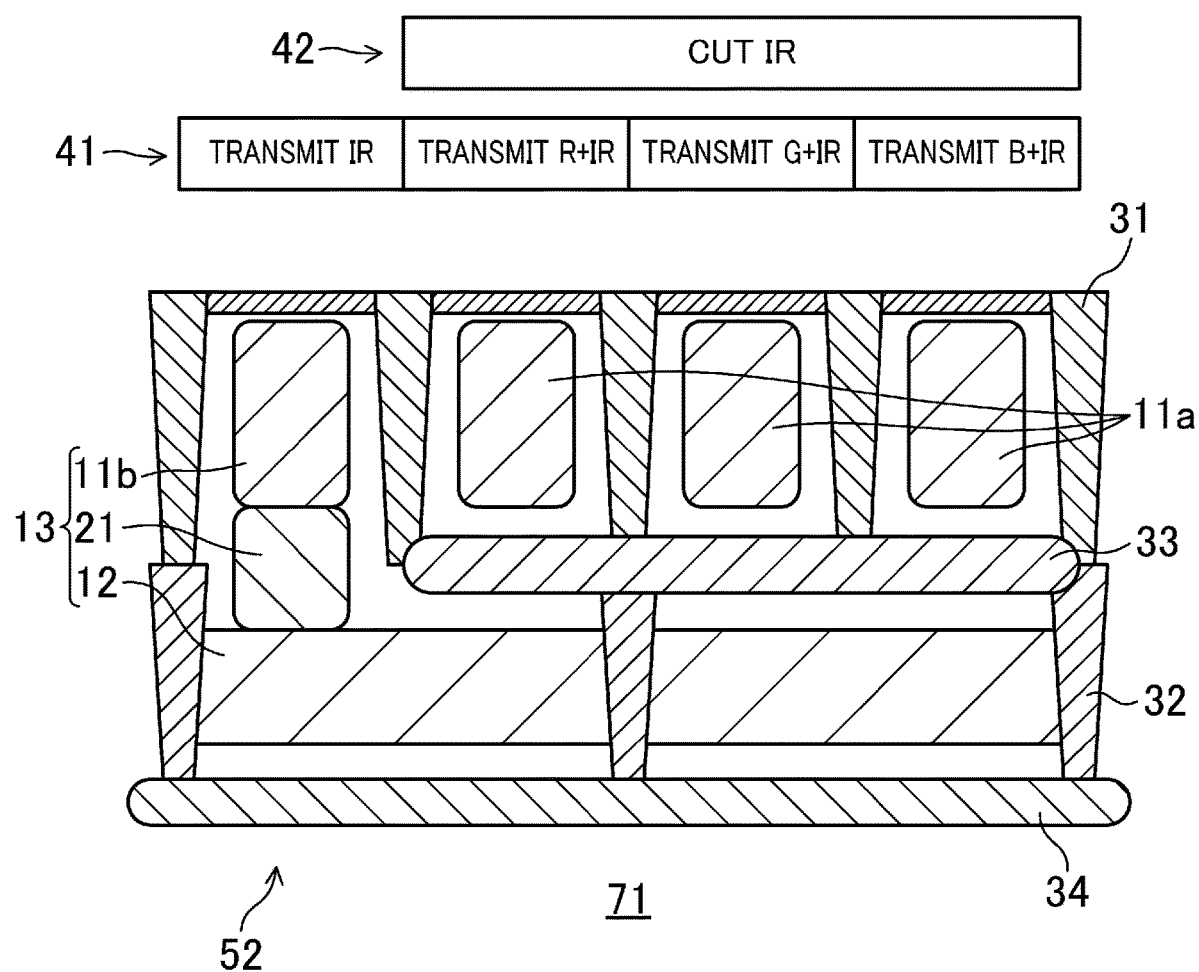
FIG. 8 is a view illustrating a modification related to a color filter in a solid-state imaging device of the present disclosure.

As described in FIGS. 7 and 8, various examples are taken for a color filter. In the case of FIG. 7, a transparent filter is placed on the shallow light receiving portion 11b forming the second light receiving portion 13 so as to give sensitivity to light not only in an infrared light region but also in a visible light region, thereby further improving sensitivity. In the case of FIG. 8, an infrared ray (IR) cut filter 42 for cutting infrared light is placed on the first light receiving portion (the shallow light receiving portions 11a) where filters 41 for the respective RGB colors are placed so that infrared light does not enter the first light receiving portion. In this manner, color reproducibility for a visible light image can be improved.

Figure 9:
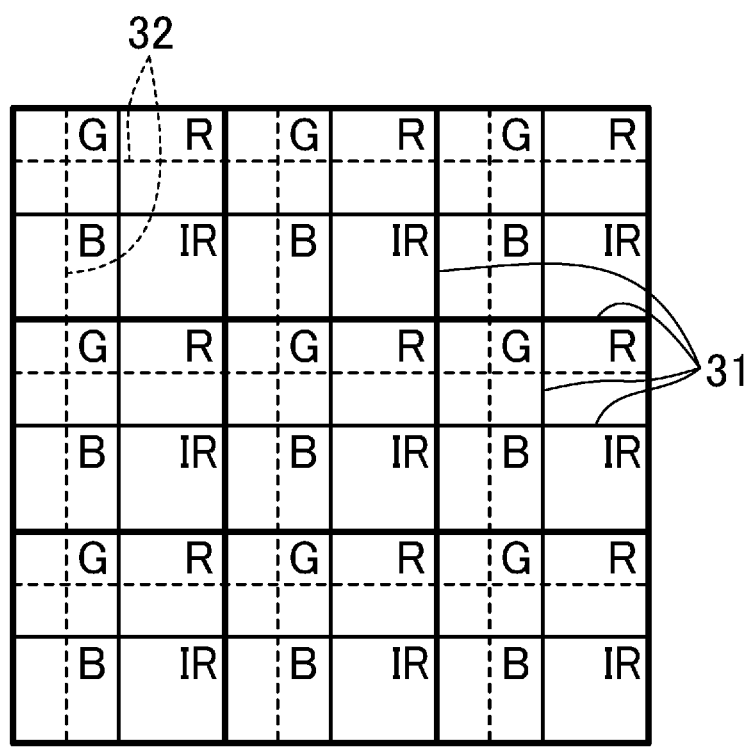
FIG. 9 is a view illustrating a modification related to arrangement of pixels in the solid-state imaging device of the present disclosure.
Figure 10:
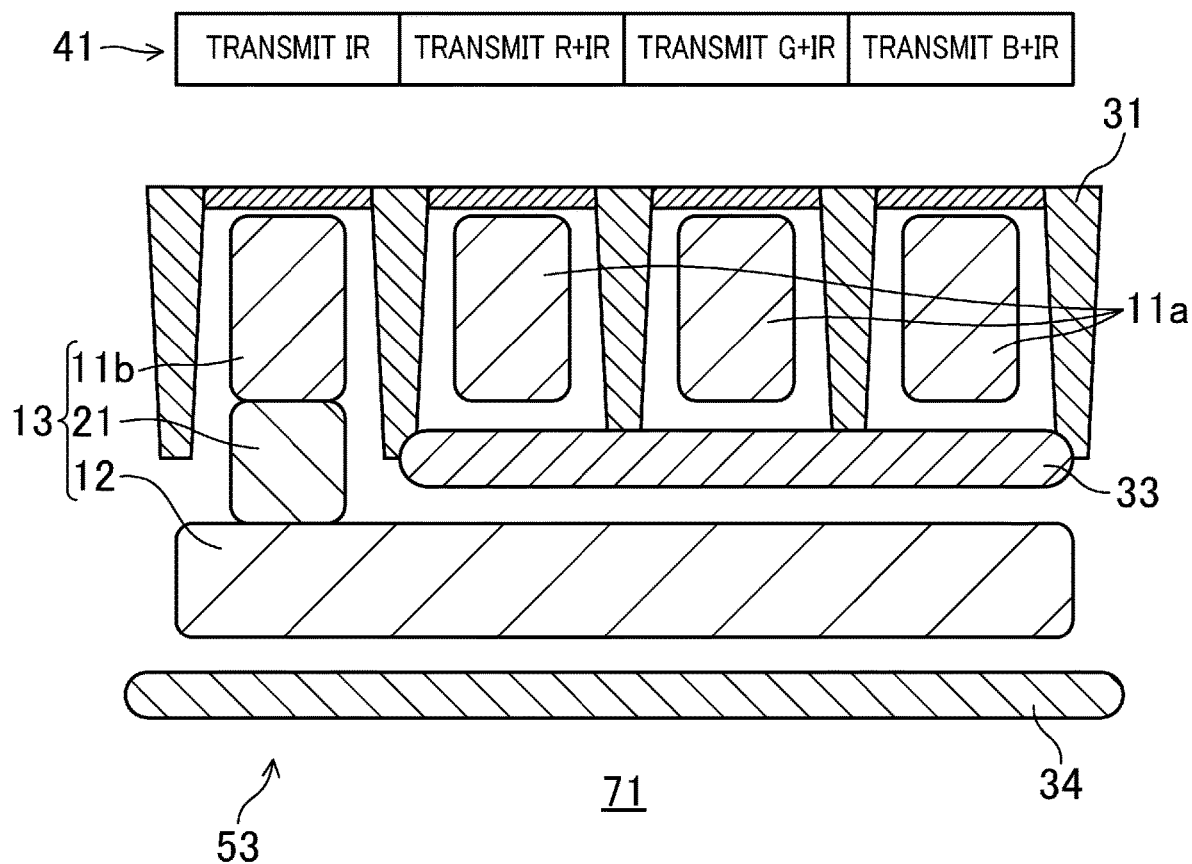
FIG. 10 is a view illustrating a modification of a solid-state imaging device of the present disclosure.

In the solid-state imaging device 50 of the embodiment, as illustrated in FIG. 1, the deep horizontal separation portion 32 that separates the deep light receiving portion 12 in the horizontal direction is provided at the boundary of a unit pixel including the 2 by 2 light receiving portions of RGB and IR. The boundary is at the position indicated by a thick line in FIG. 1 that is a plan view, and at this position, the shallow horizontal separation portion 31 and the deep horizontal separation portion 32 overlap with each other. However, this arrangement is not limiting, and, for example, the arrangement illustrated in FIG. 9 may be applied. In FIG. 9, the deep horizontal separation portion 32 is formed in a square lattice shape using the position of the shallow light receiving portion 11b forming the second light receiving portion 13 as a center. Thus, the boundary (indicated by a thick line) of a unit pixel including the light receiving portions of RGB and IR in a shallow portion, and the boundary (indicated by a broken line) of the deep light receiving portion 12 in a deep portion are present at different positions in plan view.

The deep horizontal separation portion 32 may be omitted. This omission may cause deterioration in image quality of an infrared image, but the omission can simplify a manufacturing process of the solid-state imaging device and reduce costs. This kind of configuration may be employed when priority is given to low cost.

Furthermore, in the solid-state imaging device described as above, electric charge is discharged from the light receiving portions through the transfer gates and the reset gates for reading out a signal electron. However, this processing is not limited to the solid-state imaging device. The processing can be applied to, for example, a global shutter type imaging device where a memory is arranged at a rear stage of a transfer gate. In this case, a transfer gate for transferring electric charge from a light receiving portion to a memory, a transfer gate for transferring the electric charge from the memory to an electron-voltage conversion circuit, and a reset gate are all set to be open, so that excess electric charge can be efficiently discharged from the light receiving portion to the reset gate. In this manner, a favorable image free of color mixture can be obtained.

As described above, the solid-state imaging device according to the present disclosure can reduce occurrence of color mixture caused by excess electric charge and obtain a favorable image even in a configuration in which infrared light pixels extend below visible light pixels, and is useful as a solid-state imaging device free of reduction in sensitivity.

What is claimed is:

1. A solid-state imaging device, comprising:
a plurality of pixels two-dimensionally arranged on a semiconductor substrate, wherein
each of the plurality of pixels includes a plurality of shallow light receiving portions formed under a surface of the semiconductor substrate and arranged next to each other at a same depth of the semiconductor substrate, and a deep light receiving portion formed under the shallow light receiving portions and spaced apart from the shallow light receiving portions,
the deep light receiving portion is formed in a region deeper than the shallow light receiving portions, and
one or more of the shallow light receiving portions and the deep light receiving portion are connected to each other via a connection portion, which is provided directly below the one or more of the shallow light receiving portions, so as to form a second light receiving portion,
at least one of the rest of the shallow light receiving portions forms a first light receiving portion is separated from the deep light receiving portion by a vertical separation portion, which is provided directly below the at least one of the rest of the shallow light receiving portions forming the first receiving portion,
each one or more of the shallow light receiving portions forming the second light receiving portion is provided with an IR filter which transmits only infrared light and each at least one of the rest of the shallow light receiving portions forming a first light receiving portion is provided with one of color filters,
the connection portion is formed by introducing impurities into the semiconductor substrate in a portion between the one or more of the shallow light receiving portions and the deep light receiving portion, and
when light enters the shallow light receiving portions and the second light receiving portion, photoelectric conversion is performed, and a signal electron is generated.

2. The solid-state imaging device of claim 1, wherein a potential barrier of a vertical separation portion provided between the shallow light receiving portion and the deep light receiving portion is smaller than a potential barrier of a shallow horizontal separation portion provided between a plurality of the shallow light receiving portions, and the vertical separation portion and the shallow horizontal separation portion are formed by introducing impurities into the semiconductor substrate.

3. The solid-state imaging device of claim 1, wherein a potential barrier of a vertical separation portion provided between the shallow light receiving portion and the deep light receiving portion, and a potential barrier of a vertical overflow barrier provided under the deep light receiving portion, are smaller than a potential barrier of a deep horizontal separation portion provided so as to surround the deep light receiving portion in a horizontal direction, and the vertical separation portion and the deep horizontal separation portion are formed by introducing impurities into the semiconductor substrate.

4. The solid-state imaging device of claim 1, wherein a potential barrier of a vertical overflow barrier provided under the deep light receiving portion is smaller than a potential barrier of a vertical separation portion provided between the shallow light receiving portion and the deep light receiving portion, and a potential barrier of a deep horizontal separation portion provided so as to surround the deep light receiving portion in a horizontal direction, and the vertical overflow barrier and the deep horizontal separation portion are formed by introducing impurities into the semiconductor substrate.

5. The solid-state imaging device of claim 1, wherein, each of the plurality of pixels further includes a first transfer gate for transferring a signal from the first light receiving portion, and the first transfer gate is open and electric charge is discharged from the first light receiving portion through the first transfer gate when imaging is performed using the second receiving portion.

6. The solid-state imaging device of claim 1,
wherein, each of the plurality of pixels further includes a second transfer gate for transferring a signal from the second light receiving portion, and
the second transfer gate is open and electric charge is discharged from the second light receiving portion through the second transfer gate when imaging is performed using the first receiving portion.

7. A solid-state imaging device, comprising:
a plurality of pixels two-dimensionally arranged on a semiconductor substrate, wherein
each of the plurality of pixels includes a plurality of shallow light receiving portions formed under a surface of the semiconductor substrate and arranged next to each other at a same depth of the semiconductor substrate, and a deep light receiving portion formed under the shallow light receiving portions and spaced apart from the shallow light receiving portions, the deep light receiving portion is formed in a region deeper than the shallow light receiving portions, and one or more of the shallow light receiving portions and the deep light receiving portion are connected to each other via a connection portion, which is provided directly below the one or more of the shallow light receiving portions, so as to form a second light receiving portion, at least one of the rest of the shallow light receiving portions forms a first light receiving portion is separated from the deep light receiving portion by a vertical separation portion, which is provided directly below the at least one of the rest of the shallow light receiving portions forming the first receiving portion, the vertical separation portion is not disposed between the shallow light receiving portions and the deep light receiving portion in the second light receiving portion, the connection portion is formed by introducing impurities into the semiconductor substrate in a portion between the one or more of the shallow light receiving portions and the deep light receiving portion, when light enters the shallow light receiving portions and the second light receiving portion, photoelectric conversion is performed, and a signal electron is generated, and the vertical separation portion is different in electric potential from the connection portion, wherein a potential barrier of a vertical separation portion provided between the shallow light receiving portion and the deep light receiving portion is smaller than a potential barrier of a shallow horizontal separation portion provided between a plurality of the shallow light receiving portions, and the vertical separation portion and the shallow horizontal separation portion are formed by introducing impurities into the semiconductor substrate.

8. A solid-state imaging device, comprising:

a plurality of pixels two-dimensionally arranged on a semiconductor substrate, wherein each of the plurality of pixels includes a plurality of shallow light receiving portions formed under a surface of the semiconductor substrate and arranged next to each other at a same depth of the semiconductor substrate, and a deep light receiving portion formed under the shallow light receiving portions and spaced apart from the shallow light receiving portions, the deep light receiving portion is formed in a region deeper than the shallow light receiving portions, and one or more of the shallow light receiving portions and the deep light receiving portion are connected to each other via a connection portion, which is provided directly below the one or more of the shallow light receiving portions, so as to form a second light receiving portion, at least one of the rest of the shallow light receiving portions forms a first light receiving portion is separated from the deep light receiving portion by a vertical separation portion, which is provided directly below the at least one of the rest of the shallow light receiving portions forming the first receiving portion, the vertical separation portion is not disposed between the shallow light receiving portions and the deep light receiving portion in the second light receiving portion, the connection portion is formed by introducing impurities into the semiconductor substrate in a portion between the one or more of the shallow light receiving portions and the deep light receiving portion, when light enters the shallow light receiving portions and the second light receiving portion, photoelectric conversion is performed, and a signal electron is generated, and the vertical separation portion is different in electric potential from the connection portion, wherein a potential barrier of a vertical separation portion provided between the shallow light receiving portion and the deep light receiving portion, and a potential barrier of a vertical overflow barrier provided under the deep light receiving portion, are smaller than a potential barrier of a deep horizontal separation portion provided so as to surround the deep light receiving portion in a horizontal direction, and the vertical separation portion and the deep horizontal separation portion are formed by introducing impurities into the semiconductor substrate.

9. A solid-state imaging device, comprising:

a plurality of pixels two-dimensionally arranged on a semiconductor substrate, wherein each of the plurality of pixels includes a plurality of shallow light receiving portions formed under a surface of the semiconductor substrate and arranged next to each other at a same depth of the semiconductor substrate, and a deep light receiving portion formed under the shallow light receiving portions and spaced apart from the shallow light receiving portions, the deep light receiving portion is formed in a region deeper than the shallow light receiving portions, and one or more of the shallow light receiving portions and the deep light receiving portion are connected to each other via a connection portion, which is provided directly below the one or more of the shallow light receiving portions, so as to form a second light receiving portion, at least one of the rest of the shallow light receiving portions forms a first light receiving portion is separated from the deep light receiving portion by a vertical separation portion, which is provided directly below the at least one of the rest of the shallow light receiving portions forming the first receiving portion, the vertical separation portion is not disposed between the shallow light receiving portions and the deep light receiving portion in the second light receiving portion, the connection portion is formed by introducing impurities into the semiconductor substrate in a portion between the one or more of the shallow light receiving portions and the deep light receiving portion, when light enters the shallow light receiving portions and the second light receiving portion, photoelectric conversion is performed, and a signal electron is generated, and the vertical separation portion is different in electric potential from the connection portion, wherein a potential barrier of a vertical overflow barrier provided under the deep light receiving portion is smaller than a potential barrier of a vertical separation portion provided between the shallow light receiving portion and the deep light receiving portion, and a potential barrier of a deep horizontal separation portion provided so as to surround the deep light receiving portion in a horizontal direction, and the vertical overflow barrier and the deep horizontal separation portion are formed by introducing impurities into the semiconductor substrate.

10. A solid-state imaging device, comprising:

a plurality of pixels two-dimensionally arranged on a semiconductor substrate, wherein each of the plurality of pixels includes a plurality of shallow light receiving portions formed under a surface of the semiconductor substrate and arranged next to each other at a same depth of the semiconductor substrate, and a deep light receiving portion formed under the shallow light receiving portions and spaced apart from the shallow light receiving portions, the deep light receiving portion is formed in a region deeper than the shallow light receiving portions, and one or more of the shallow light receiving portions and the deep light receiving portion are connected to each other via a connection portion, which is provided directly below the one or more of the shallow light receiving portions, so as to form a second light receiving portion, at least one of the rest of the shallow light receiving portions forms a first light receiving portion is separated from the deep light receiving portion by a vertical separation portion, which is provided directly below the at least one of the rest of the shallow light receiving portions forming the first receiving portion, the vertical separation portion is not disposed between the shallow light receiving portions and the deep light receiving portion in the second light receiving portion, the connection portion is formed by introducing impurities into the semiconductor substrate in a portion between the one or more of the shallow light receiving portions and the deep light receiving portion, when light enters the shallow light receiving portions and the second light receiving portion, photoelectric conversion is performed, and a signal electron is generated, and the vertical separation portion is different in electric potential from the connection portion, wherein, each of the plurality of pixels further includes a first transfer gate for transferring a signal from the first light receiving portion, and the first transfer gate is open and electric charge is discharged from the first light receiving portion through the first transfer gate when imaging is performed using the second receiving portion.

11. A solid-state imaging device, comprising:

a plurality of pixels two-dimensionally arranged on a semiconductor substrate, wherein each of the plurality of pixels includes a plurality of shallow light receiving portions formed under a surface of the semiconductor substrate and arranged next to each other at a same depth of the semiconductor substrate, and a deep light receiving portion formed under the shallow light receiving portions and spaced apart from the shallow light receiving portions, the deep light receiving portion is formed in a region deeper than the shallow light receiving portions, and one or more of the shallow light receiving portions and the deep light receiving portion are connected to each other via a connection portion, which is provided directly below the one or more of the shallow light receiving portions, so as to form a second light receiving portion, at least one of the rest of the shallow light receiving portions forms a first light receiving portion is separated from the deep light receiving portion by a vertical separation portion, which is provided directly below the at least one of the rest of the shallow light receiving portions forming the first receiving portion, the vertical separation portion is not disposed between the shallow light receiving portions and the deep light receiving portion in the second light receiving portion, the connection portion is formed by introducing impurities into the semiconductor substrate in a portion between the one or more of the shallow light receiving portions and the deep light receiving portion, when light enters the shallow light receiving portions and the second light receiving portion, photoelectric conversion is performed, and a signal electron is generated, and the vertical separation portion is different in electric potential from the connection portion, wherein, each of the plurality of pixels further includes a second transfer gate for transferring a signal from the second light receiving portion, and the second transfer gate is open and electric charge is discharged from the second light receiving portion through the second transfer gate when imaging is performed using the first receiving portion.

* * * * *